(12) United States Patent  (10) Patent No.: US 8,283,663 B2
Kobayashi  (45) Date of Patent: Oct. 9, 2012

(54) MULTICHIP DEVICE

(75) Inventor: Kazuyuki Kobayashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 1022 days.

(21) Appl. No.: 11/680,659

(22) Filed: Mar. 1, 2007

(65) Prior Publication Data

US 2007/0205504 A1   Sep. 6, 2007

(30) Foreign Application Priority Data

Mar. 2, 2006  (JP) .................................. 2006-056695

(51) Int. Cl.
*H01L 23/58* (2006.01)
(52) U.S. Cl. .......... 257/48; 257/723; 257/694; 257/693; 257/695; 257/778
(58) Field of Classification Search .................. 257/723, 257/691, 693, 694, 695, 698, 48
See application file for complete search history.

(56) References Cited

U.S. PATENT DOCUMENTS

| | | | | |
|---|---|---|---|---|
| 5,729,553 | A * | 3/1998 | Motohara | 714/733 |
| 5,901,048 | A * | 5/1999 | Hu | 361/783 |
| 6,714,002 | B2 * | 3/2004 | Stadler | 324/762.06 |
| 2001/0032885 | A1* | 10/2001 | Groeger | 235/492 |
| 2003/0031189 | A1* | 2/2003 | Larson et al. | 370/401 |

FOREIGN PATENT DOCUMENTS

| | | |
|---|---|---|
| JP | 04-250644 | 9/1992 |
| JP | 2003-004808 | 1/2003 |
| JP | 2003-077296 | 3/2003 |
| JP | 2003-296296 A | 10/2003 |
| JP | 2004-085366 A | 3/2004 |

OTHER PUBLICATIONS

Japanese Office Action dated Mar. 8, 2011, in Japanese Application No. 2006-056695.

* cited by examiner

*Primary Examiner* — Bradley K Smith
*Assistant Examiner* — Timor Karimy
(74) *Attorney, Agent, or Firm* — Sughrue Mion, PLLC (57) ABSTRACT

A multichip device, which achieves a normal operation and a testing operation without the needs for terminals dedicated for the testing and/or an interposer substrate, is provided. The peripheral chip also includes a switching unit for providing a switching between a normal mode that provides a first connection condition and a testing mode that provides a second coupling connection condition. The switching unit, in turn, provides connections of at least some of a plurality of outside terminals to the functional circuits, respectively, in the normal mode, and connects at least some of a plurality of outside terminals to the inside terminals in the testing mode. Thus, the normal operation and the testing operation can be carried out without the needs for the external terminals and/or the interposer substrate, which are employed for the purpose of only the testing.

14 Claims, 7 Drawing Sheets

PRIOR ART

MULTICHIP DEVICE

This application is based on Japanese patent application NO. 2006-056695, the content of which is incorporated hereinto by reference.

BACKGROUND

1. Technical Field

The present invention relates to a multichip device, including a first terminal and provided with a first circuit chip and a second circuit chip mounted thereon, and particularly relates to a multichip device that is switchable between the first connection status and the second connection status.

2. Related Art

Conventionally, multichip devices having a plurality of circuit chips, which are utilized in combination and are mounted on one device base member, are developed for practical use, and the devices are called as system in package (SIP). Here, a conventional example of such multichip device will be described as follows in reference to FIG. 7.

Figure 7:
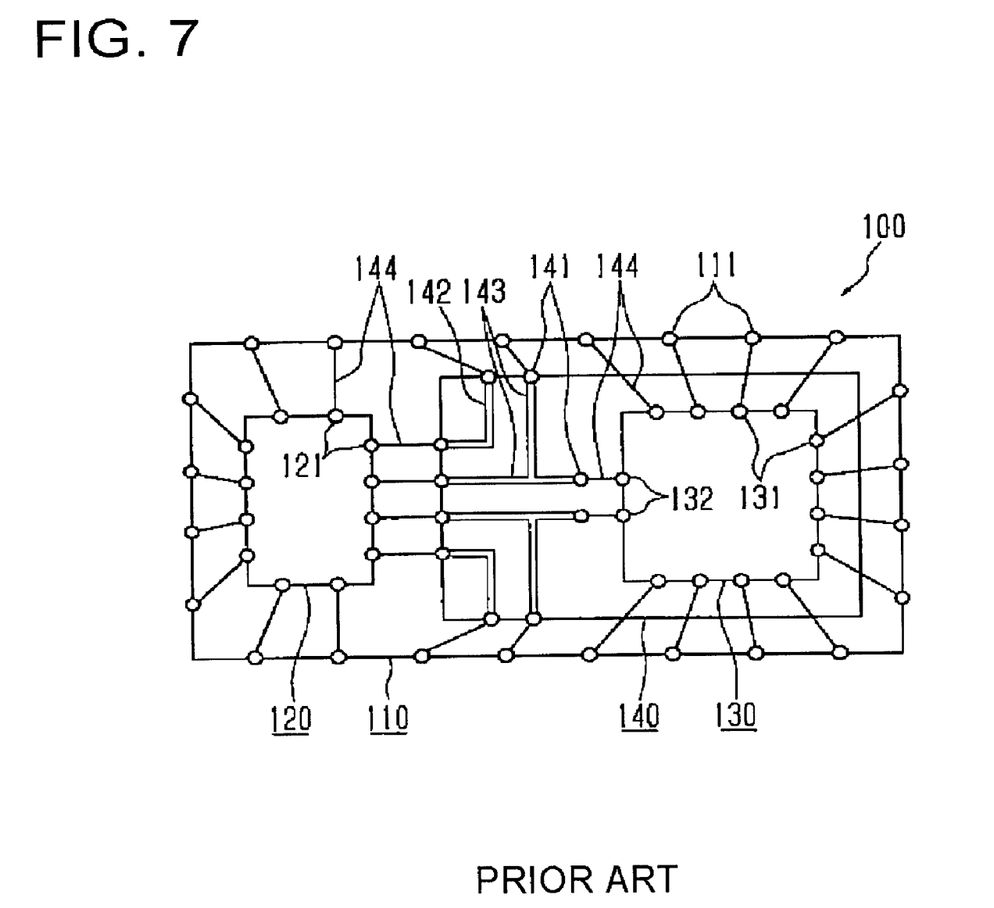
FIG. 7 is a block diagram, illustrating an internal structure of a conventional multichip device.

A multichip device 100 includes a rectangular device base member 110 composed of an insulating substrate or the like. External terminals 111 composed of a plurality of first terminals are formed in a circumference of such device base member 110.

In addition, the device base member 110 is provided with a main chip 120 serving as a first circuit chip and a peripheral chip 130 serving as a second circuit chip mounted thereon. However, the peripheral chip 130 is mounted through an interposer substrate 140.

The main chip 120 is composed of chip components formed as so-called microcomputer, and digital hardware such as a central processing unit (CPU), a read only memory (ROM), a random access memory (RAM), an interface (I/F) unit and the like are included therein (not shown).

The main chip 120 is provided with main terminals 121 serving as a plurality of second terminals formed on the outer surface thereof. Then, an internal CPU or the like is appropriately connected to such main terminals 121. The peripheral chip 130 is also formed as a chip component, and an analog circuit or the like that is capable of supplementing functions of the main chip 120 is contained therein as various functional circuits (not shown).

The peripheral chip 130 is provided with outside terminals 131 serving as a plurality of third terminals and inside terminals 132 serving as a plurality of fourth terminals. Internal functional circuits are appropriately connected to the terminals 131 and 132.

In addition to above, terminals of the peripheral chip 130 connected to external terminals 111 are referred to as outside terminals 131, and terminals thereof connected to the main chip 120 are referred to as inside terminals 132. Nevertheless, these are just temporary names for simplifying the description, and thus there is no special semantic in these names.

The interposer substrate 140 is provided with a plurality of connection terminals 141 formed in the circumference or the surface thereof. The connection terminals 141 are, in turn, connected via printed wirings 142 and 143.

These printed wirings 142 and 143 are composed of the printed wiring 142 of a single-line form that simply relays connections between the main chip 120 and the external terminals 111 and the printed wiring 143 of a two-way form that connections among the main chip 120, the peripheral chip 130 and the external terminals 111.

In the multichip device 100 illustrated here, the main chip 120 is directly mounted on the device base member 110 as described above. On the other hand, the peripheral chip 130 is mounted via the interposer substrate 140.

Many of the main terminals 121 of the main chip 120 are connected to the peripheral external terminals 111 via bonding wires 144. On the other hand, the part of the main terminals 121 are connected to the connection terminals 141 of the circumference of the interposer substrate 140 facing thereof.

The outside terminals 131 of the peripheral chip 130 are connected to the peripheral external terminals 111 via the bonding wires 144. On the other hand, the inside terminals 132 are connected to the connection terminals 141 in the surface of the interposer substrate 140 facing thereof.

Consequently, in such multichip device 100, several of the main terminals 121 of the main chip 120, several of the inside terminals 132 of the peripheral chip 130 and several of the external terminals 111 are mutually connected via the printed wiring 143 of two-way form in the interposer substrate 140.

The multichip device 100 having the structure as described above involves switchable operating modes of, for example, a normal mode that provides a first connection status and a testing mode that provides a second connection status.

In the normal mode, the multichip device 100 is incorporated in electronic equipment such as, for example, a portable telephone, and various types of circuits that are contained in the electronic equipment are connected to the external terminals 111 to serve as external circuits (not shown).

In such case, no external circuit is connected to the external terminals 111 that are connected via the printed wiring 143 of two-way form in the interposer substrate 140. Consequently, mutual communication between the main chip 120 and the peripheral chip 130 without an obstacle can be achieved by the printed wirings 143.

In such circumstance, for example, the main chip 120 and the peripheral chip 130 are in the normal mode with the aid of the electronic equipment. Consequently, the main chip 120 and the peripheral chip 130 are in the condition for conducting the normal operation.

In the case, the external circuits communicate with main chip 120 and peripheral chip 130, and the main chip 120 also mutually communicates with the peripheral chip 130. Consequently, the multichip device 100 functions as a part of the electronic equipment.

In addition to above, manufacturers who manufacture and deliver the multichip device 100 as described above ordinary inspect the multichip device 100, before delivering the multichip device 100. In the inspection, the multichip device 100 is loaded in a testing equipment (not shown), and the testing terminal of a testing equipment is appropriately connected to the external terminal 111.

Under such circumstance, for example, the main chip 120 and the peripheral chip 130 are in the testing mode with the aid of the testing equipment. Consequently, the main chip 120 and the peripheral chip 130 are in the condition for conducting the testing operation.

Such testing operations includes not only a simultaneous testing for the main chip 120 and the peripheral chip 130 under a connection status that is similar to the connection status in the normal operation, but also a testing for only the main chip 120.

In such case, high impedance is put for the inside terminals 132 of the peripheral chip 130. Consequently, communication between the testing equipment and the main chip 120 without an obstacle can be achieved with the aid of the two-way form printed wiring 143 of the interposer substrate 140.

Currently, there are various proposals for the multichip device 100 as described above (see, for example, Japanese Patent Laid-Open NO. 2004-085366). Besides, controlling an I/O port by employing a dedicated circuit is proposed, though such proposal is not related to the multichip device (see, for example, Japanese Patent Laid-Open NO. 2003-296296).

In the multichip device 100 described above, several of the main terminals 121 of the main chip 120 are connected to several of the inside terminals 132 of the peripheral chip 130 via the printed wiring 143 of two-way form in the interposer substrate 140, and are also connected to several of the external terminals 111.

Consequently, communication between the main chip 120 and the peripheral chip 130 can be achieved via the main terminals 121 and inside terminals 132 in the normal mode, and communication of the main chip 120 and the peripheral chip 130 selectively with the external terminals 111 can be achieved in the testing mode.

However, such external terminals 111 are not utilized in the normal mode as described above, and thus are formed for conducting the testing. Similarly, the printed wirings 143 of two-way form interposer substrate 140 is also formed for conducting the testing. In other words, the interposer substrate 140 is required for conducting the testing.

Further, it may be often difficult that some of the main terminals 121 located in the positions opposed to the peripheral chip 130 of the main chip 120 are connected to the external terminals 111 directly, instead of the peripheral chip 130, via the bonding wires 144.

In such case, the printed wirings 142 and 143 of the interposer substrate 140 are also utilized to connect some of the main terminals 121 opposed to the peripheral chip 130 to the external terminals 111.

In other words, the interposer substrate 140 is still required for connecting of the main terminals 121 in the above-described locations with the external terminals 111. Consequently, the dimension of the multichip device 100 is increased due to the presences of the external terminals 111 and the interposer substrate 140, which are not required for the normal operation, and the productivity thereof is reduced.

SUMMARY OF THE INVENTION

According to one aspect of the present invention, there is provided a multichip device, comprising a first terminal; a first circuit chip having a second terminal; and a second circuit chip having a third terminal connected to the first terminal, a fourth terminal connected to the second terminal, and a first functional circuit, wherein the second circuit chip includes a switching unit that provides a switching between a first connection status and a second connection status, the first connection status providing a condition that the third terminal is connected to the first functional circuit, and the second connection status providing a condition that the third terminal is connected to the fourth terminal.

Therefore, in the multichip device of the present invention, the functional circuit of the second circuit chip is connected to the first terminal in the first connection status, and the first terminal is connected to the first circuit chip through the second circuit chip in the second connection status.

In addition to above, all kinds of components appeared in the present invention are not necessarily independent elements, and variety of configurations including: a plurality of components comprising one member; a component being formed of a plurality of members; a certain component being a portion of other component; a portion of a certain component is utilized as a portion of other component, or the like, may also be available.

Since the multichip device of the present invention includes the second circuit chip, which includes the switching unit that switches between a first connection status for providing the condition that the third terminal is connected to the functional circuit and the second connection status for providing the condition that the third terminal is connected to the fourth terminal, so that the functional circuit of the second circuit chip is connected to the first terminal in the first connection status, the functional circuit of the second circuit chip can be utilized in the normal mode from the external thereof, for example. Further, since the first circuit chip is connected through the second circuit chip to the first terminal in the second connection status, an access to the first circuit chip from the external thereof can be achieved in the testing mode, for example. Consequently, the normal operation and the testing operation can be carried out without the needs for the first terminal and/or the interposer substrate, which are employed for the purpose of only the testing.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

A configuration of the present invention will be described in reference to FIG. 1 to FIG. 4. In the following descriptions, an identical name is assigned to an identical element that has been also appeared in the above description of the prior art, and the detailed description thereof will not be repeated.

Figure 1:
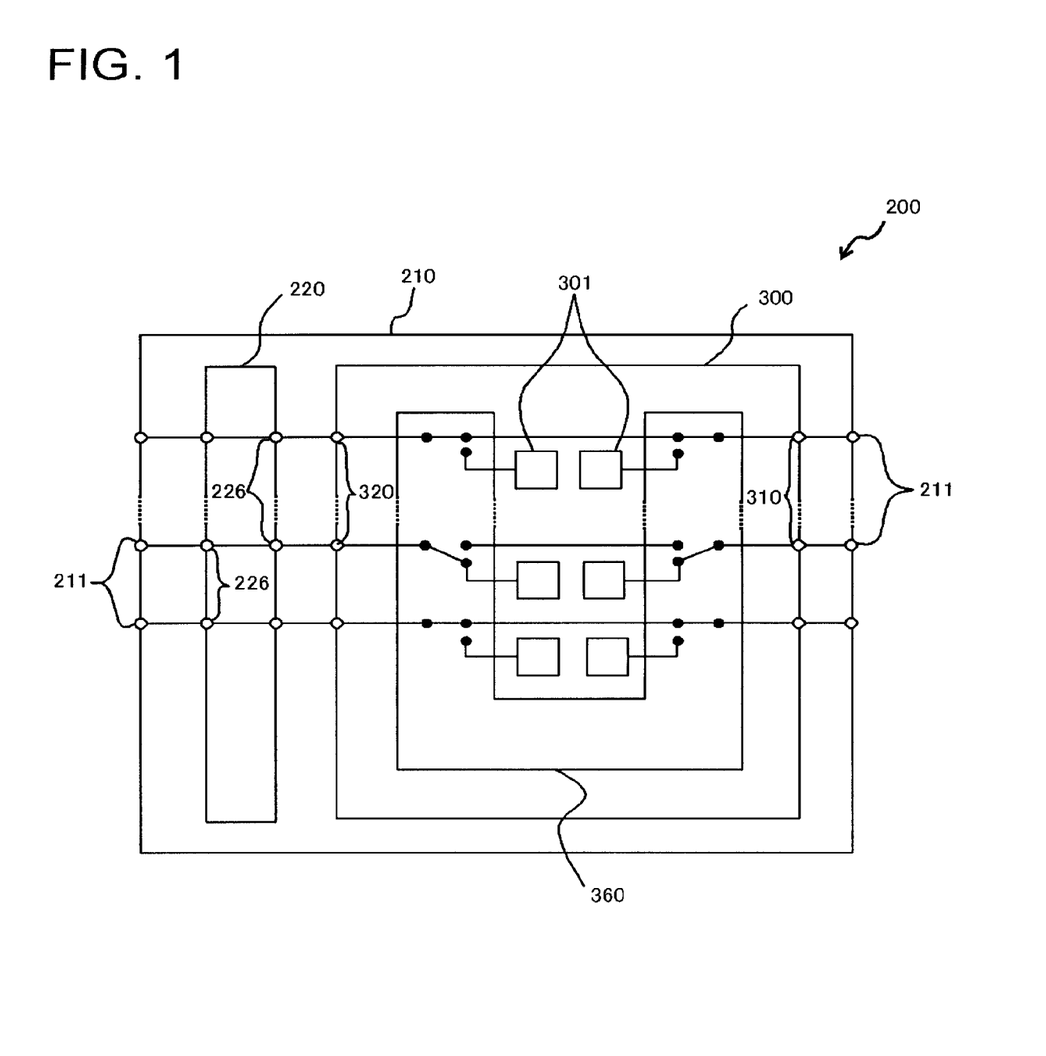
FIG. 1 is a schematic block diagram, illustrating an internal structure of a multichip device of an embodiment according to the present invention.
Figure 2:
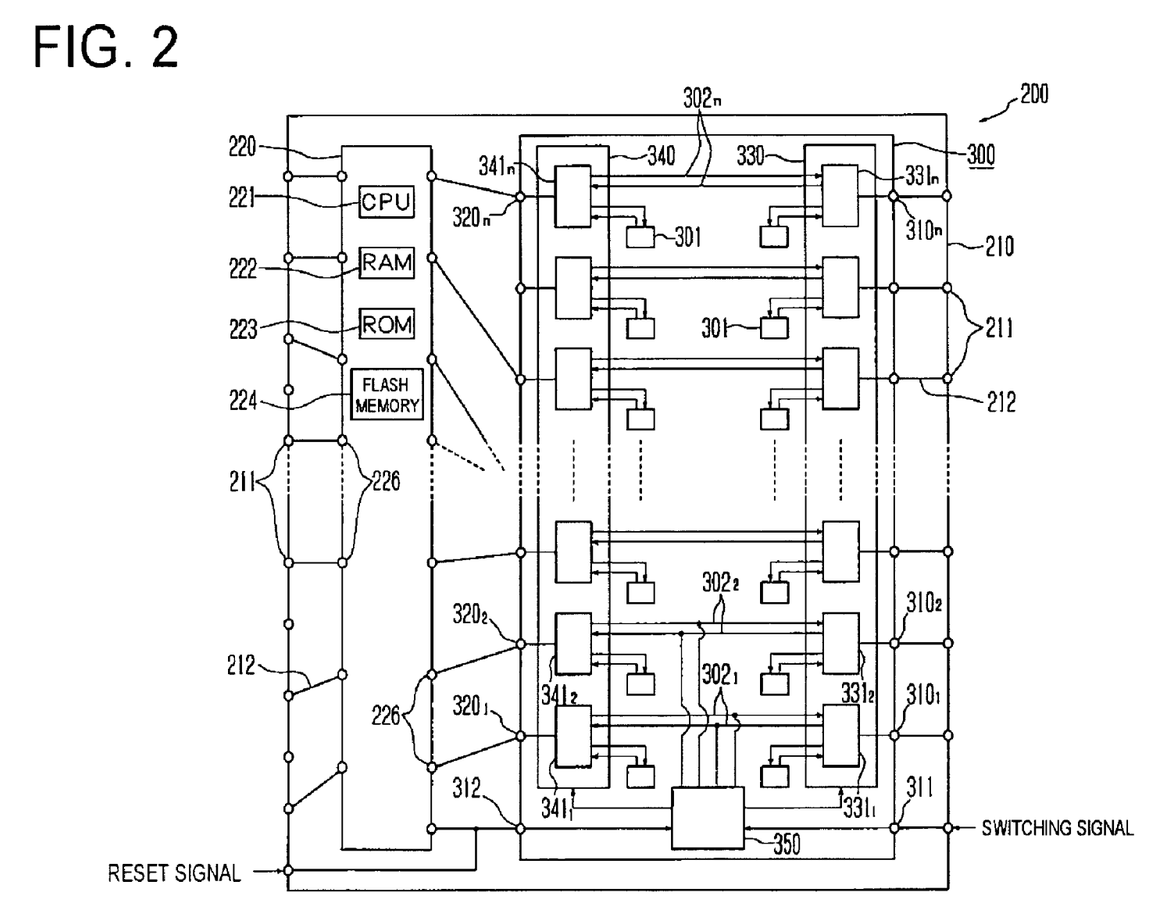
FIG. 2 is a detailed block diagram, illustrating the internal structure of the multichip device.
Figure 3:
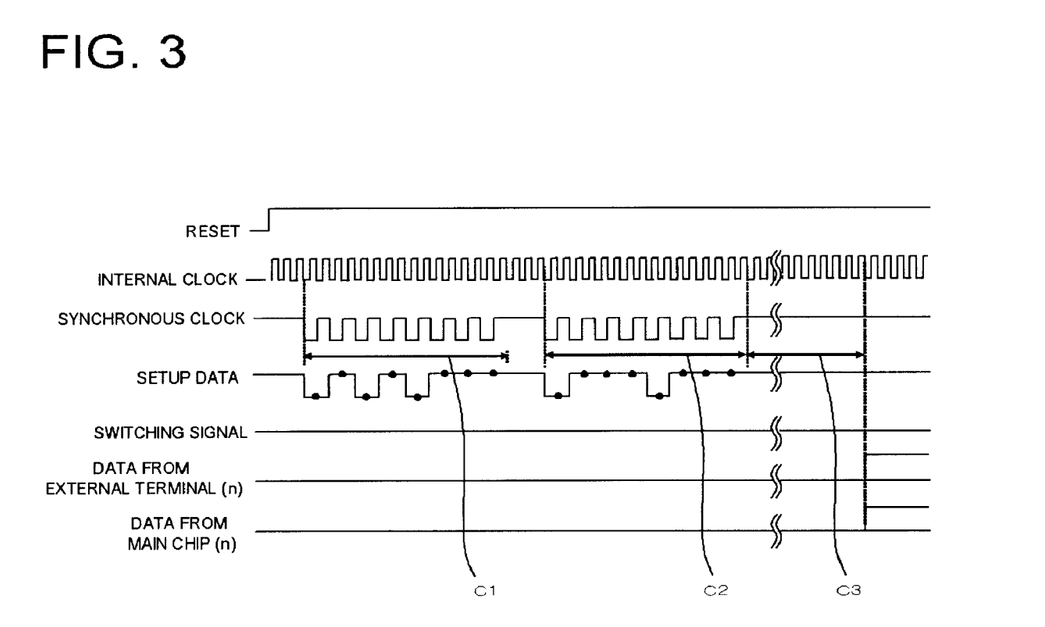
FIG. 3 is a timing chart, showing various types of signals entered to a peripheral chip during an initial setup in a normal mode.
Figure 4:
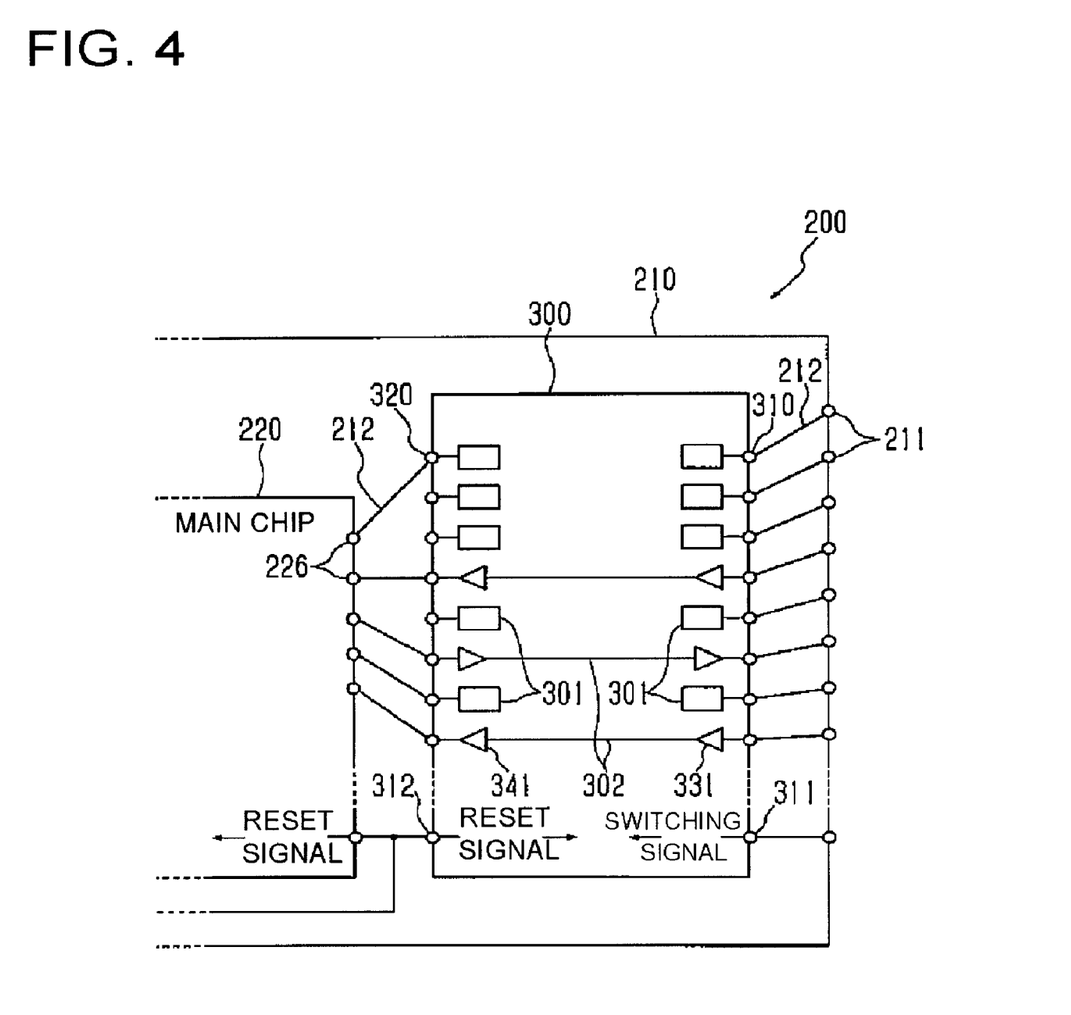
FIG. 4 is a schematic diagram, illustrating a condition that an internal connection of the peripheral chip is controllably switched.

Here, FIG. 1 is a schematic block diagram, illustrating an internal structure of a multichip device of an embodiment according to the present invention, FIG. 2 is a more specific block diagram, illustrating the internal structure of the multichip device, FIG. 3 is a timing chart, illustrating various types of signals entering into a peripheral chip at an initial setting in a normal mode, and FIG. 4 is a schematic diagram, illustrating a condition that internal connections of the peripheral chip is switched under a controlled condition.

A multichip device 200 of the present embodiment includes, as shown in FIG. 1, a plurality of external terminals 211 serving as first terminals, a main chip 220 serving as a first circuit chip and With peripheral chip 300 serving as a second circuit chip.

The main chip 220 has a plurality of main terminals 226 serving as second terminals. The peripheral chip 300 includes a plurality of outside terminals 310 connected to the external terminals 211 serving as third terminals, a plurality of inside terminals 320 connected to the main terminals 226 serving as fourth terminals, and a plurality of functional circuits 301.

The peripheral chip 300 also includes a switching unit 360 for switching between a normal mode that provides a first connection status and a testing mode that provides a second connection status. The switching unit 360, in turn, connects at least some of a plurality of outside terminals 310 to the functional circuits 301, respectively, in the normal mode, and connects at least some of a plurality of outside terminals 310 to the inside terminals 320 in the testing mode.

More specifically, the multichip device 200 of the present embodiment includes a rectangular device base member 210 composed of an insulating substrate or the like, which is provided with a plurality of external terminals 211 formed in a circumference thereof, similarly as the above-described conventional multichip device 100. The device base member 210 also includes the main chip 220 and the peripheral chip 300 mounted thereon.

However, the multichip device 200 of the present embodiment includes no interposer substrate 140 mounted thereon unlikely as the above-described conventional multichip device 100, and the peripheral chip 300 is directly connects to the external terminals 211 and the main chip 220 via bonding wires 212.

The main chip 220 is compose of chip components formed as so-called microcomputer, and as shown in FIG. 2, digital hardware such as a central processing unit (CPU) 221, a random access memory (RAM) 222, a read only memory (ROM) 223, a flash memory 224 or the like are included therein. The main chip 220 is provided with a plurality of main terminals 226 formed on an outer surface thereof. The internal CPU 221 or the like is, in turn, appropriately connected to such main terminal 226.

Some of a plurality of main terminals 226 of the main chip 220 are connected to the external terminals 211 circumscribing thereof via the bonding wires 212. Besides, some others of the main terminals are directly connected to the peripheral chip 300 via the bonding wires 212 as described above.

In addition to above, one of the main terminals 226 is an input terminal for a reset signal. This is, in turn, connected to the external terminal 211 that receives a reset signal, together with the reset input terminal 312 of the peripheral chip 300.

Such peripheral chip 300 is still formed as a chip component. Analog circuits supplementing functions of the main chip 220 serving as various types of functional circuits 301 are included therein. The peripheral chip 300 includes n (n is an integer number of not less than 2) of the outside terminals 310, n of the inside terminals 320, a switching input terminal 311 and a reset input terminal 312, all of which are formed on the outer surface thereof. The outside terminals 310, the switch input terminal 311 and the reset input terminal 312, in turn, are connected to the external terminals 211, and the inside terminals 320 are connected to the main terminals 226 of the main chip 220.

In addition to above, in the multichip device 200 of the present embodiment, the peripheral chip 300 has an outside controlling circuit 330 and an inside controlling circuit 340. A plurality of the outside terminals 310 are, in turn, to the outside controlling circuit 330 and a plurality of the inside terminal 320 are connected to the inside controlling circuit 340.

Besides, the peripheral chip 300 has a connection controlling circuit 350. Such connection controlling circuit 350 is connected to, in turn, the switching input terminal 311, the reset input terminal 312, the outside controlling circuit 330 and the inside controlling circuit 340. More specifically, in the multichip device 200 of the present embodiment, the switching unit 360 is composed of the above-described outside controlling circuit 330 the inside controlling circuit 340 and the connection controlling circuit 350.

The outside controlling circuit 330 has n of the outside switching circuits 331. The inside controlling circuits 340 have, in turn, n of inside switching circuits 341. First to nth outside switching circuits 331 are connected to first to nth outside terminals 310, respectively. First to nth inside switching circuits 341 are, in turn, connected to first to nth inside terminals 320, respectively.

Further, respective interconnections among the first to nth outside switching circuits 331 and respective interconnections among the first to nth inside switching circuits 341 are made via first to nth internal interconnects 302, and specific functional circuits 301 are connected to the outside switching circuits 331 and the inside switching circuits 341, respectively.

Among the inside interconnects 302, only the first and the second inside interconnects 302 are also connected to the connection controlling circuit 350. Such connection controlling circuit 350 is, in turn, connected to first to nth outside switching circuits 331 and first to nth inside switching circuits 341.

In the configuration as described above, the multichip device 200 of the present embodiment performs an operation in the normal mode under a condition of being mounted on an electronic equipment (not shown). Further, the multichip device 200 also performs an operation in the testing mode under a condition of being connected to a testing equipment (not shown).

In the multichip device 200 of the present embodiment, a signal for switching to the normal mode is transferred to the peripheral chip 300 of the multichip device 200 from the electronic equipment in the operation of the normal mode, and then, an ordinary setup data is transferred to the peripheral chip 300 from the main chip 220.

Further, a signal for switching to the testing mode is transferred to the peripheral chip 300 of the multichip device 200 from the electronic equipment in the operation of the testing mode, and then, a testing setup data is transferred thereto.

More specifically, in the operation according to the normal mode, the electronic equipment provides a condition of a low mode for the external terminal 211 connected to the switching input terminal 311 of the multichip device 200, so that such condition is input to the switching input terminal 311 input the external terminal 211 as a signal for switching to the normal mode.

As described above, once a signal for switching to the normal mode is entered into the multichip device 200, an ordinary setup data as a first setup data is forwarded to the first inside terminal 320, and the second inside terminal $320_2$ of the peripheral chip 300 from the main terminal 226 of the main chip 220.

On the other hand, in the operation according to the testing mode, the testing equipment provides a condition of a high mode for the external terminals 211 connected to the switching input terminal 311 of the multichip device 200, so that such condition is input to the switching input terminal 311 from the external terminals 211 as a signal for switching to the testing mode.

As described above, once a signal for switching to the testing mode is entered into the multichip device 200, a testing setup data as a second setup data is forwarded to the first inside terminal $320_1$ and the second inside terminal $320_2$ of the peripheral chip 300 from the testing equipment through the first outside terminal $310_1$ and the second outside terminal $310_2$.

Once an ordinary setup data is externally input to the connection controlling circuit 350 after a signal for switching to the normal mode is externally entered thereto as described above, the connection controlling circuit 350 controllably switches the outside controlling circuit 330 and the inside controlling circuit 340, corresponding to such ordinary setup data, as described before.

Further, once a testing setup data is externally input to the connection controlling circuit 350 after a signal for switching to the testing mode is externally input thereto as described above, the connection controlling circuit 350 controllably switches the outside controlling circuit 330 and the inside controlling circuit 340, corresponding to such testing setup data, as described before.

In the main chip 220, the above-described ordinary setup data is, for example, stored in the flash memory 224, as shown in FIG. 2. Then, the ordinary setup data thereof is output by the CPU 221 and is input to the first and the second inside terminals $320_1$ and $320_2$.

In addition to above, in the multichip device 200 of the present embodiment, operating controls for the outside controlling circuit 330 and the inside controlling circuit 340 by the connection controlling circuit 350 as described above are conducted in every start-up of the multichip device 200 by a power activation or a reset input.

In an initial state just after the start-up, the outside terminal 310 and inside terminal 320 are connected to internal interconnect 302 with the aid of the outside switching circuit 331 and the inside switching circuit 341. Consequently, the ordinary setup data is input to the connection controlling circuit 350 from the first and the second inside terminals $320_1$ and $320_2$ through the first and the second internal interconnects $302_1$ and $302_2$. Similarly, the testing setup data is input to the connection controlling circuit 350 from the first and the second the outside terminals $310_1$ and $310_2$ through the first and the second internal interconnects $302_1$ and $302_2$.

Aspect of the embodiment of the multichip device 200 according to the present embodiment will be more specifically described in reference to FIG. 2 to FIG. 4. The multichip devices 200 of the present embodiment are mass-produced in a condition of, for example, including no main chip 220 mounted thereon, and stocked (not shown), and the multiple types of the main chips 220, which have been independently prepared, are selectively mounted thereon, according to applications of the devices.

In this case, the main terminals 226 are connected to the inside terminals 320 via the bonding wires 212, corresponding to internal configurations of the main chip 220 and the peripheral chip 300.

In addition to above, in the multichip device 200 of the present embodiment, enough number and flexible arrangement of the inside terminals 320 of the peripheral chip 300 and the external terminals 211 of the device base member 210 are provided for allowing to apply for multiple types of the main chips 220. Consequently, for example, the inside terminal 320 and the external terminal 211 that are not connected to the main terminal 226 may be included in the multichip device 200, as shown in FIG. 2.

The ordinary setup data that corresponds to the internal configurations of the main chip 220 and the peripheral chip 300 and to the connection relation between the main terminal 226 and the inside terminal 320 is registered in the flash memory 224 of the main chip 220.

On the other hand, a circuit testing is performed for the multichip device 200 of the present embodiment at an initial stage of the product shipping or the like. In such case, the testing setup data is registered in the testing equipment that is connected to the multichip device 200.

As described above, the multichip device 200 of the present embodiment is set a normal mode and a testing mode as switchable operating modes of a normal mode and a testing mode similarly as in the conventional multichip device 100, and the device is operated in the normal mode (not shown) in the condition that the device is incorporated in an electronic equipment such as a portable telephone.

In the case, when the power supply of the electronic equipment is switched on, the multichip device 200 is correspondently activated, and is initialized to be in a condition of being ready for operating in the normal mode. More specifically, once a power supply is switched on to provide a stable electrical voltage in the electronic equipment, a reset signal is entered into the main chip 220 and the peripheral chip 300 from one of the external terminals 211 in the multichip device 200.

In such case, in the peripheral chip 300 in the initial state, the outside terminal 310 and inside terminal 320 are connected to internal interconnect 302 with the aid of the outside switching circuit 331 and the inside switching circuit 341, as described above. Consequently, the first and the second outside terminals $310_1$ and $310_2$ and the first and the second inside terminals $320_1$ and $320_2$ are connected to the connection controlling circuit 350 via the first and the second internal interconnects $302_1$ and $302_2$.

In such condition, as indicated in the timing chart of FIG. 3, the electronic equipment provides a condition of a low mode for one of the external terminal 211 of the multichip device 200 as the signal for switching to the normal mode, so that the switching input terminal 311 of the peripheral chip 300 connected thereto is in a condition of a low mode. Here, the connection controlling circuit 350 is set in a condition for receiving acquiring an ordinary setup data input to the internal interconnects $302_1$ and $302_2$ from the first and the second inside terminals $320_1$ and $320_2$.

Under such condition, for example, the main chip 220 performs a division of an internal clock that is the reference clock of the CPU 221 to generate a synchronous clock, and the thus generated synchronous clock is transmitted into the first inside terminal $320_1$ of the peripheral chip 300 from one of the main terminals 226 as a part of the ordinary setup data.

In same time, the main chip 220 is transmitted the ordinary setup data registered in the flash memory 224 to the second inside terminal $320_2$ of the peripheral chip 300 from the other main terminal 226 while synchronizing the signal with the synchronous clock, for example, by utilizing a circuit dedicated for the synchronization (not shown).

Then, in the peripheral chip 300, the connection controlling circuit 350 acquires the synchronous clock and the ordinary setup data from the first and the second inside terminals $320_1$ and $320_2$ through the first and the second internal interconnects $302_1$ and $302_2$.

Such ordinary setup data is set as serial data that includes, for example, two-valued data for indicating whether n of the outside switching circuits $331_1$ to $331_n$ and n of the inside switching circuits $341_1$ to $341_n$ are connected to the internal interconnect 302 or connected to the functional circuit 301, which is transmitted simultaneously with a synchronous clock of 2n period in the first and the second phases C1 and C2.

Then, the connection controlling circuit 350 acquires the ordinary setup data in every timing of starts for changing the synchronous clock between low and high in the above-described first and second phases C1 and C2, so that a determination whether n of the outside switching circuits $331_1$ to $331_n$ and n of the inside switching circuits $341_1$ to $341_n$ are connected to the internal interconnect 302 or connected to the functional circuit 301 is stored.

In the peripheral chip 300, the connection controlling circuit 350 in the status that the acquisition of the ordinary setup data has been completed in the first and the second phases C1 and C2 as described above controllably switches the objects for connection of n of the outside switching circuits $331_1$ to $331_n$ and n of the inside switching circuits $341_1$ to $341_n$ in a predetermined alert time C3 by utilizing the stored ordinary setup data. Consequently, for example, as shown in FIG. 4, an appropriate condition for the operation in the normal mode is achieved for the peripheral chip 300.

In addition to above, as shown in FIG. 3, the main chip 220 in the status that the transfer of the ordinary setup data has been completed provides that, for example, the data registered in the flash memory 224 is utilized to complete the own initial setting in the alert time C3, and similarly the electronic equipment also completes the initial setting of the external circuit.

Then, the main chip 220 and the external circuit of the electronic equipment in the status that the initial settings have been completed in this way start the communication with the peripheral chip 300 or the like to achieve the operation in the normal mode.

In such case, some of the external terminals 211 and the main terminals 226 are connected to the functional circuit 301 of the peripheral chip 300. Consequently, the main chip 220 and/or the external circuit can utilize the functional circuit 301 of the peripheral chip 300 for achieving the normal operation of the device.

Further, some of the external terminals 211 and/or the main terminals 226 are interconnected via the internal interconnects 302 of the peripheral chip 300. Consequently, an intercommunication between the main chip 220 and the external circuit can be achieved through the peripheral chip 300.

In addition to above, some of the main terminals 226 are also directly connected to the external terminals 211 without connecting via the peripheral chip 300. Consequently, in the operation in the normal mode as described above, a direct communication between the main chip 220 and the external circuits can also be achieved.

The outside terminals 310 of the peripheral chip 300 are connected to the external terminals 211. Consequently, in the operation in the normal mode as described above, a direct communication between the functional circuit 301 connected to the outside terminal 310 and the external circuits can also be achieved.

On the other hand, when the multichip device 200 is tested as described above, the multichip device 200 is mounted on a testing equipment and testing terminals are connected to the external terminals 211. In such case, the testing equipment provides a condition of a high mode for one of the external terminals 211 of the multichip device 200 as a signal for switching to the testing mode.

Then, the switching input terminals 311 of the peripheral chip 300 connected thereto are in high mode, so that the connecting controlling circuit 350 is set in a condition for acquiring a testing setup data input to the internal interconnects $302_1$ and $302_2$ from the first and the second outside terminals $310_1$ and $310_2$.

Under such condition, the testing equipment transmits the synchronous clock to the first outside terminal $310_1$ of the peripheral chip 300 from one of the external terminal 211 as a part of the testing setup data, and also transmits the registered testing setup data from other main terminal 226 to the second outside terminal $310_2$ of the peripheral chip 300.

Thereafter, similarly as in the case of the normal mode, an appropriate condition for the operation in the testing mode is achieved for the peripheral chip 300 and the main chip 220. Consequently, the testing equipment accesses to the peripheral chip 300 and the main chip 220 from the external terminals 211 to conduct various testing.

In such case, some of the external terminals 211 and the main terminals 226 are connected to the functional circuit 301 of the peripheral chip 300. Thus, the main chip 220 and the testing equipment can utilize the functional circuit 301 of the peripheral chip 300 for conducting the testing.

Further, some of the external terminals 211 and/or the main terminals 226 are interconnected via the internal interconnects 302 of the peripheral chip 300. Consequently, an intercommunication between the main chip 220 and the testing equipment can be achieved through the peripheral chip 300.

The multichip device 200 of the present embodiment involves that the peripheral chip 300 controllably switches the connection relations among the main terminals 226, the external terminals 211 and the functional circuit 301 as described above, such that the normal operation and the testing operation can be carried out without the needs for the external terminals 211 and/or the interposer substrate, which are employed for the purpose of only the testing. Thus, a miniaturization of the whole device can be achieved.

Further, in the conventional multichip device having terminals dedicated for the testing, the terminals dedicated for the testing are necessarily left as they are in the normal state, without having any connecting. Thus, if an interconnect is incorrectly connected to the terminal dedicated for the testing, improper operation is performed in the multichip device. Nevertheless, such improper operation resulted from the presence of the terminals dedicated for the testing is avoided in the multichip device 100 according to the present embodiment.

Besides, the conventional multichip device requires the interposer substrate as described above for connecting the second terminals in the position opposing the second circuit chip to the first terminals. However, according to the multichip device 200 of the present embodiment, the peripheral chip 300 can connect the main terminal 226 to the external terminal 211 as described above, without a need for having the interposer substrate.

Further, the multichip device 200 of the present embodiment utilizes the terminals $310_1$, $310_2$, $320_1$ and $320_2$, which are utilized for transmitting signals, during the operations in the testing mode and the normal mode, such that the testing setup data the ordinary setup data are input in the peripheral chip 300. Thus, no terminal dedicated for inputting the testing setup data is required, and thus further miniaturization of the whole device can be achieved.

In particular, the peripheral chip 300 is in a condition ready for accepting the testing setup data and the ordinary setup data in an initial state just after the start-up. Thus, the terminals $310_1$, $310_2$, $320_1$ and $320_2$, which are utilized for transmitting signals during the operations, are utilized to input the testing setup data and the ordinary setup data without causing any problem.

Moreover, a controllable switching is performed on the basis of the input testing setup data or the ordinary setup data, and then, after a predetermined time for completing such controllable switching is passed, the testing operation and/or the normal operation are started. Thus, the testing operation and the normal operation can be adequately performed.

On the other hand, a signal for switching between the normal mode and the testing mode is input from one of the external terminal 211 to the peripheral chip 300. Thus, a set up for switching between the normal mode and the testing mode can be ensured in the peripheral chip 300 with a simple structure.

Further, in the multichip device 200 of the present embodiment, the peripheral chip 300 provides, in the testing mode, interconnections of at least some of the main terminals 226 and the external terminals 211, which, otherwise, are connected to the functional circuit 301 in the normal mode, respectively. Thus, for example, the functions of the main chip 220, which is ordinarily connected to the functional circuit 301 of the peripheral chip 300, can also be utilized for the testing.

Moreover, the multichip device 200 of the present embodiment can utilize a reset signal as a trigger to perform a controllable switching between the main chip 220 and the peripheral chip 300. However, such reset signal is entered from one of the external terminals 211 to both of the main chip 220 and the peripheral chip 300.

Thus, number of the external terminals 211 can be reduced to provide an improved productivity of the multichip device 200, simultaneous enter of an identical reset signal into the main chip 220 and the peripheral chip 300 can be ensured.

Further, the peripheral chip 300 controllably switches the connection relations for the main chip 220 between the external terminals 211 and the functional circuit 301 as described above. Therefore, the multichip devices 200 in a condition of including no main chip 220 mounted thereon are mass-produced, and the multiple types of the main chips 220 can be selectively mounted thereon. Thus, the multichip device 200 can be achieved with the multiple types of main chips 220 and the multiple types of multichip devices 200 can be produced with an improved productivity.

In particular, the testing setup data is input from the external terminal 211 to the peripheral chip 300. On the other hand, the ordinary setup data is input from the main chip 220 to the peripheral chip 300. Thus, even if the multiple types of main chips 220 are selectively mounted as described above, ordinary setup data suitable for the main chip 220 can be supplied to the peripheral chip 300.

Figure 5:
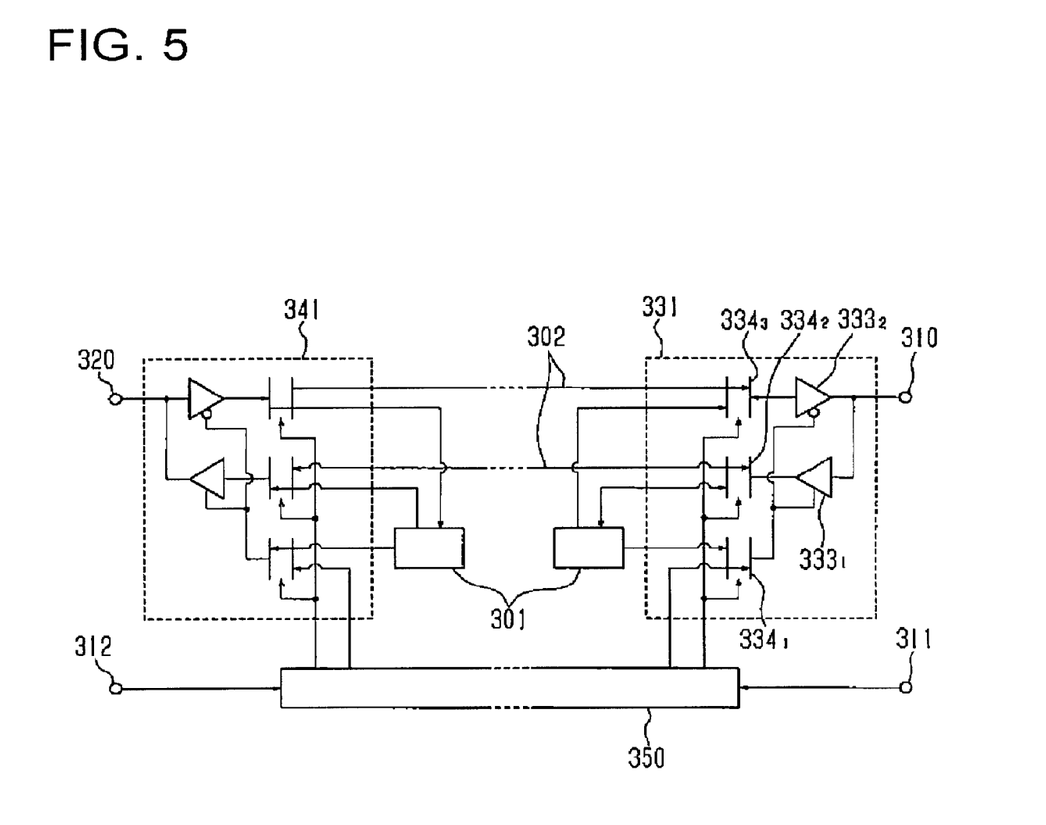
FIG. 5 is a schematic circuit diagram, illustrating a substantial part of the peripheral chip of the multichip device.

Here, an example of a specific configuration of the outside switching circuit 331 and the inside switching circuit 341 will be described as follows on the basis of FIG. 5. Here, FIG. 5 is a schematic circuit diagram, illustrating a substantial part of the peripheral chip of the multichip device.

Each of the outside switching circuit 331 and the inside switching circuit 341 illustrated here includes first and second direction control circuits $333_1$ and $333_2$ and first to third signal selective circuits $334_1$ to $334_3$. Thus, the outside terminal 310 and the inside terminal 320 are connected to the internal interconnect 302 and the functional circuit 301 through these direction control circuits 333 and the signal selective circuits 334.

In addition to above, the outside switching circuits 331 and the inside switching circuits 341 are formed to have basically the same structure. Thus, only the structure of the outside switching circuits 331 will be described here, and descriptions on the inside switching circuits 341 are not repeated.

The first and the second direction control circuits $333_1$ and $333_2$ of the outside switching circuit 331 allows a signal transmitting to only one direction. However, the circuits are connected to the outside terminal 310 in parallel under the condition that the direction of the signal allowed for being transmitted are opposite each other. The first and the second direction control circuit $333_1$ and $333_2$ are switched on/off by an input of two-valued data to the control terminal. Here, the first signal selective circuit $334_1$ is commonly connected to the control terminal.

However, a control terminal is reversed only for the second direction control circuit $333_2$. Thus, the output of two-valued data from the first signal selective circuit $334_1$ provides a condition that only one of the first and the second direction control circuits $333_1$ and $333_2$ is switched on, the direction for allowing the signal transmitted to and from the outside terminal 310 is controlled to be an Input or an output.

The first to the third signal selective circuits $334_1$ to $334_3$ selectively connect two input (or is output) terminals to one output (or input) terminal by input of two-valued data to the control terminal. On the other hand, the connection controlling circuit 350 is commonly connected to such control terminal.

In the first signal selective circuit $334_1$, the connection controlling circuit 350 and the functional circuit 301 are connected to two input terminals, respectively. As describe above, one of the output terminals is connected to control terminals of the first and the second direction control circuits $333_1$ and $333_2$ under a condition that one of the circuits is reversed.

In the second signal selective circuit $334_2$, the internal interconnect 302 and the functional circuit 301 are connected to two output terminals, respectively. An output terminal of the first direction control circuit 3331 is connected to one of the input terminals.

In the third signal selective circuit $334_3$, the internal interconnect 302 and the functional circuit 301 are connected to two input terminals, respectively. An input terminal of the second direction control circuit $333_2$ is connected to one of the output terminals.

Concerning the ordinary setup data in the multichip device 200 as described above, two-valued data for switching the connecting as described above, for example, is set as serial data of the first phase C1, as shown in FIG. 3. Two-valued data for switching the direction of the signal transmission is set as serial data that are transmitted simultaneously with a synchronous clock of 2n period in the second phase C2.

The serial data of the second such phase C2 composed of two-valued data for switching the direction of the signal transmission, which determine directions of the signal transmission through n of the outside switching circuits $331_1$ to $331_n$ and through n of the inside switching circuits $341_1$ to $341_n$ to be input direction to or output direction from the outside terminal 310 and the inside terminal 320.

In such case, the connection controlling circuit 350 acquires the ordinary setup data in every timing of a start for changing the synchronous clock between low and high, so that a determination whether n of the outside switching circuits $331_1$ to $331_n$ and n of the inside switching circuits $341_1$ to $341_n$ are connected to the internal interconnect 302 or connected to the functional circuit 301 is stored, in addition to storing respective directions of the signal transmission.

Thus, in the outside switching circuits 331, a first control signal from the connection controlling circuit 350 controllably switches the connection status on whether the outside terminal 310 is connected to the internal interconnect 302 or connected to the functional circuit 301, and when the outside terminal 310 is connected to the internal interconnect 302, a second control signal from the connection controlling circuit 350 controllably switches the direction of the signal transmission. In addition to above, when the outside terminal 310 is connected to the functional circuit 301, a control signal released from the functional circuit 301 controllably switches the direction of the signal transmission.

In the multichip device 200 as described above, the peripheral chip 300 provides a switching of the connection relations among the main terminal 226, the external terminal 211 and the functional circuit 301, in addition to switching the direction of the signal transmission. Thus, only a required signal can be adequately transmitted.

It is not intended that the present invention is not particularly limited to the embodiments described above, and various modification are also allowed within the scope and the spirits of the present invention. For example, the description of the above-described configuration specifically illustrates the internal structure and the operation scheme of the peripheral chip 300 that controllably switches the connection relations among the main chip 220, the external terminal 211 and the functional circuit 301. Alternatively, this may be modified in various ways.

For example, the description of the above-described configuration illustrates that the peripheral chip 300 controllably switches only whether the outside terminal 310 and the inside terminal 320 are connected to the predetermined inside terminal 320 and outside terminal 310 or connected to the predetermined functional circuit 301. On the other hand, controlling circuits 330 and 340 may alternatively be formed to be in multiple-layered form, so that any combinations of a plurality of the outside terminals 310, the inside terminals 320 and the functional circuits 301 can be respectively connected (not shown).

Further, the description of the above-described configuration illustrates that the switching signal and the reset signal are entered to the peripheral chip 300 from the external terminals 211 dedicated for each of these signals. Alternatively, these signals may also be entered to the peripheral chip 300 from the main chip 220.

Further, the description of the above-described configuration illustrates that reset signal is entered from the external terminal 211 to both of the main chip 220 and the peripheral chip 300. Alternatively, the reset signal may be entered to the main chip 220 and the peripheral chip 300 from the external terminals 211 dedicated for respective chips (not shown).

Further, the description of the above-described configuration illustrates that the reset signal necessarily generated in the start-up of the multichip device 200 is utilized as a trigger for the initial setup. Alternatively, separately from the reset signal, a dedicated trigger signal may be generated to provide an initialization of the peripheral chip 300.

Further, the description of the above-described configuration illustrates that the reset signal generated in the start-up of the multichip device 200 is continuously maintained. Alternatively, it may be possible to cancel the generation of the reset signal after the administration of the initial setup of the peripheral chip 300.

Further, the description of the above-described configuration illustrates that the multiple types of main chips 220 are selectively mounted on the multichip device 200. Alternatively, only one type of the main chip 220 may be employed.

Even in such case, the multichip device 200 requires no testing-dedicated external terminals 211 and/or the interposer substrate, and the functions of the main chip 220, which is ordinarily connected to the functional circuit 301 of the peripheral chip 300, can also be utilized for the testing.

Further, the description of the above-described configuration illustrates that after the multiple types of main chips 220 are selectively mounted on the multichip device 200, the ordinary setup data for the peripheral chip 300 is registered in such main chip 220. Alternatively, the main chips 220, into which the ordinary setup data is registered in advance, may be prepared, and such chips may be mounted on the multichip device 200.

Further, the description of the above-described configuration illustrates that enough number and flexible arrangement of the inside terminals 320 of the peripheral chip 300 and the external terminals 211 of the device base member 210 are provided for allowing an use of multiple types of the main chips 220.

Alternatively, the types of the corresponding main chips 220 may be carefully selected so that minimum number of the inside terminals 320 and the external terminals 211 are required, and thus there may be no inside terminal 320 and no external terminal 211 that are not connected to the main terminal 226 (not shown).

Further, the description of the above-described configuration illustrates the configuration that the outside terminals 310 are arranged in one side of the rectangular peripheral chip 300 and the external terminals 211 are arranged in the opposite side thereof, for the purpose of simplicity in the illustration. Alternatively, of course, the arrangement of these terminals 310 and 211 may be modified in various way without obstructing the connections thereof with the main chip 220.

Further, the description of the above-described configuration illustrates that same number of the outside terminal 310 and inside terminal 320 of peripheral chip 300 are included for the purpose of simplicity in the illustration. Alternatively, it may be possible that more outside terminal 310 is employed than the inside terminal 320. In such case, some of the outside terminals 310 are connected to the functional circuit 301 without connecting to the inside terminals 320, and such connection may not be controllably switched.

Further, while the description of the above-described configuration illustrates that a signal transmission is performed from the external through the peripheral chip 300 to the main chip 220, an electric power may also be supplied from the external through the peripheral chip 300 to the main chip 220, for example.

Figure 6A:
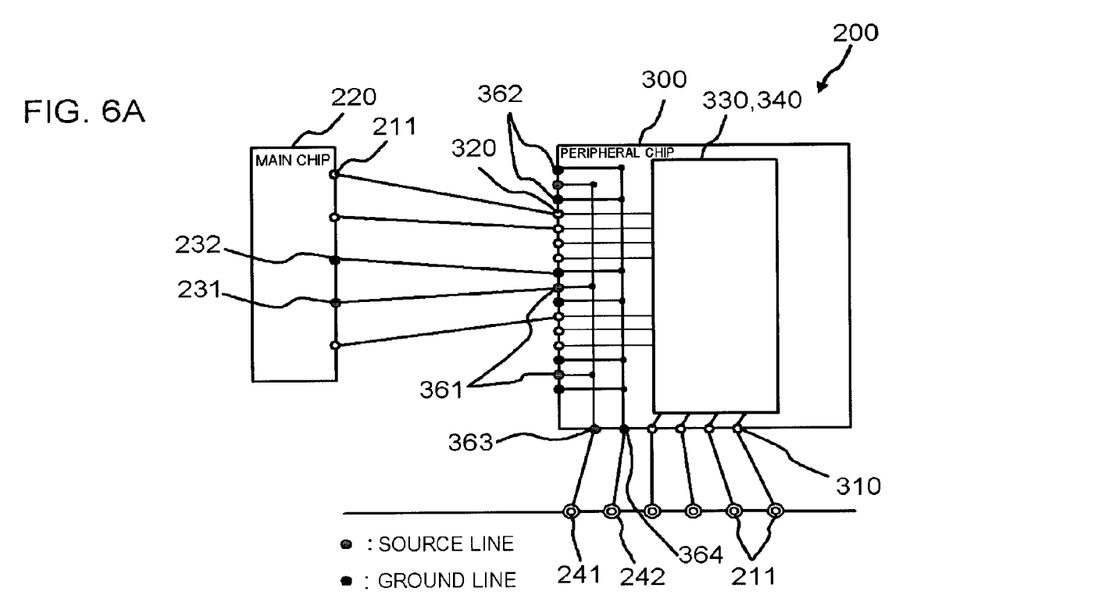
FIGS. 6A and 6B are schematic diagrams, illustrating a connection relation between the supplying power electrodes of the peripheral chip and the receiving power electrodes of the main chip.
Figure 6B:
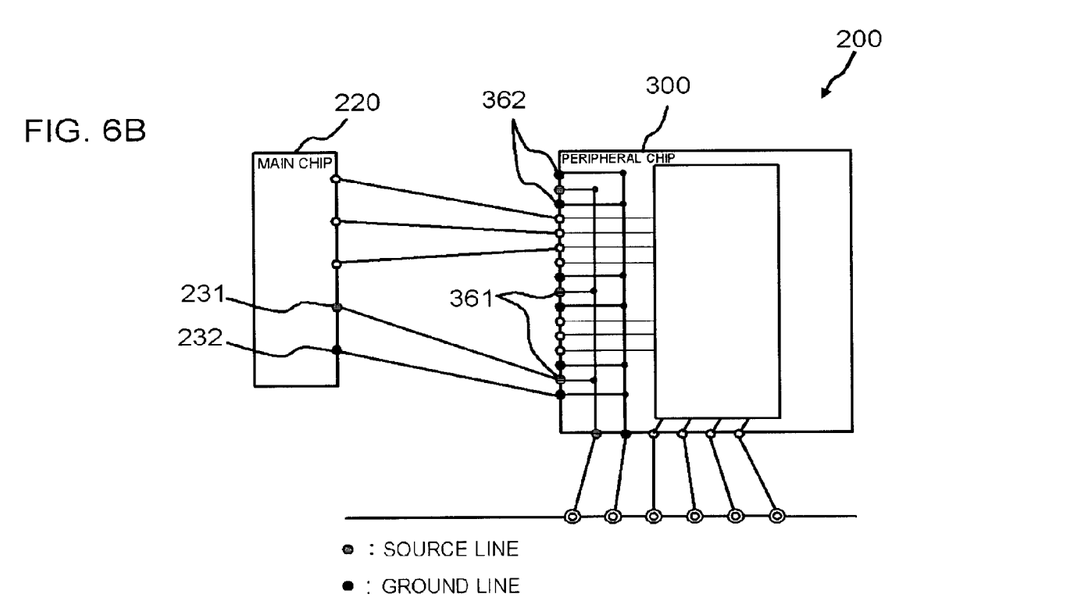

This will be described as follows in reference to FIG. 6. FIG. 6 is a schematic diagram, illustrating a connection relation between a supplying power electrode of a peripheral chip and a receiving power electrode of a main chip. The peripheral chip 300 illustrated here includes multiple pairs of supplying power electrodes 361 and 362 in positions thereof facing the main chip 220, and multiple types of main chips 220 include a pair of receiving power electrodes 231 and 232 in positions thereof facing the peripheral chip 300.

One pair in the multiple pairs of supplying power electrodes 361 and 362 are selectively connected to the receiving power electrodes 231 and 232 corresponding to the type of the main chip 220. More specifically, electrodes for electric power 241, 242, 363, 364, 361, 362, 231 and 232 are formed in the device base member 210, in the main chip 220 and in the peripheral chip 300, independently from the above described terminals for signal 211, 226, 310 and 320.

One pair of the supplying power electrodes 241 and 242 of the device base member 210 are formed on an outer surface of the device base member 210, similarly as the external terminals 211. Here, one of these electrodes is applied with a source voltage from an external circuit or a testing equipment, and the other is applied with a ground voltage.

In the peripheral chip 300, a pair of the receiving power electrodes 363 and 364 is connected to multiple pairs of the supplying power electrodes 361 and 362. Such pair of the receiving power electrodes 363 and 364 are, in turn, connected to a pair of the supplying power electrodes 241 and 242 of the device base member 210.

A pair of the receiving power electrodes 231 and 232 of the main chip 220 are, as described above, connected to one pair in the multiple pairs of the supplying power electrodes 361 and 362 of the peripheral chip 300. Thus, a source voltage and a ground voltage are applied from the supplying power electrodes 241 and 242 of the device base member 210 to the receiving power electrodes 231 and 232 of the main chip 220.

According to the configuration as described above, as shown in FIGS. 6A and 6B, an electric power can be easily supplied to the multiple types of main chips 220 having the receiving power electrodes 231 and 232 in different positions, and therefore the multichip device 200 can be achieved by the multiple types of main chips 220.

Particularly, in the above-described configuration, multiple pairs of the supplying power electrodes 361 and 362 of the peripheral chip 300 include two supplying power electrodes 362 for ground voltage, which are disposed in both sides of one supplying power electrode 361 for source voltage. Thus, an improved degree of flexibility in providing the condition for the connection thereof with the main chip 220 can be achieved.

It is apparent that the present invention is not limited to the above embodiment, and may be modified and changed without departing from the scope and spirit of the invention.

What is claimed is:

1. A multichip device comprising:
    an external terminal; and
    a first and second semiconductor devices:
    wherein the first semiconductor device comprises:
        a first internal terminal,
    wherein the second semiconductor device comprises:
        a substrate; and
        a second internal terminal that is coupled to the external terminal;
        a third internal terminal that is coupled to the first internal terminal;
        a switching unit that is formed above the substrate,
        a first wiring that is formed above the substrate, and that is arranged between the second internal terminal and the switching unit;
        a first functional circuit that is formed above the substrate;
        a second wiring that is formed above the substrate, and that is arranged between the switching unit and the first functional circuit; and
        a third wiring that is formed above the substrate, and that is arranged between the switching unit and the third internal terminal,
        wherein:
        the switching unit switches between a first connection configuration and a second connection configuration,
        the first wiring is coupled to the second wiring in the first connection configuration, and
        the first wiring is coupled to the third wiring in the second connection configuration.

2. The multichip device according claim 1,
    wherein the first wiring and the second wiring are not formed above the first semiconductor device.

3. The multichip device according claim 2,
    wherein the first internal terminal is connected with the external terminal through the first and third wirings.

4. The multichip device according to claim 1, wherein in the first connection configuration, the switching unit connects the second internal terminal to the first functional circuit.

5. The multichip device according to claim 4, wherein the second semiconductor device further comprises a second functional circuit, and
    in the first connection configuration, the switching unit connects the second internal terminal to the first functional circuit and connects the third internal terminal to the second functional circuit, and
    in the second connection configuration, the switching unit connects the second internal terminal to the third internal terminal.

6. The multichip device according to claim 5,
    wherein:
    the multichip device comprises a plurality of the external terminals,
    the first semiconductor device comprises a plurality of the first internal terminals,
    the second semiconductor device comprises a plurality of the second internal terminals, a plurality of the third internal terminals, a plurality of the first functional circuits corresponding respectively to the second internal terminals, and a plurality of the second functional circuits corresponding respectively to the third internal terminals,
    in the first connection configuration, the switching unit connects at least two of the second internal terminals to the first functional circuit respectively, and connects at least two of the third internal terminals to the second functional circuits respectively, and
    in the second connection configuration, the switching unit connects at least two of the second internal terminals, having first disconnected the connection with the first functional circuits, to the third internal terminals, having first disconnected the connection with the second functional circuits respectively.

7. The multichip device according to claim 1, wherein the switching unit further comprises a direction control circuit that switches a direction of signal transmission between the second internal terminal and the third internal terminal when the second internal terminal and the third internal terminal are connected.

8. The multichip device according to claim 7, further comprising a control terminal,
    wherein the direction control circuit switches the direction of signal transmission in response to a control signal to the control terminal.

9. The multichip device according to claim 1, wherein a signal for switching between the first connection configuration and the second connection configuration is entered to the switching unit from the external terminal through the second internal terminal.

10. The multichip device according to claim 9, wherein the first connection configuration or the second connection configuration is selected by transmitting first setup data for the first connection configuration to the switching unit from the first internal terminal to the third internal terminal, or transmitting second setup data for the second connection configuration to the switching unit from the external terminal to the second internal terminal.

11. The multichip device according to claim 10, wherein the multichip device selectively includes multiple types of the first semiconductor devices mounted thereon that output the first setup data corresponding to types of the setup.

12. The multichip device according to claim 1, wherein the second circuit chip comprises a plurality of supplying power electrodes located at different positions along a face of the second semiconductor device that faces the first semiconductor device, the first semiconductor device comprises two receiving power electrodes on a face of the first semiconductor device that faces the second semiconductor device, and wherein the receiving power electrodes of the first semiconductor device are connected to only the supplying power electrodes of the second semiconductor device that are aligned physically with the receiving power electrodes.

13. The multichip device according to claim 1, wherein the switching unit comprises:

a second functional circuit;

a connection control circuit which is connected to a switching input terminal and a reset input terminal;

an inside switching circuit which is connected to the third internal terminal, the first functional circuit, and the connection control circuit;

an outside switching circuit which is connected to the second internal terminal, the second functional circuit, and the connection control circuit; and an internal interconnect that connects the inside switching circuit and the outside switching circuit.

14. The multichip device according to claim 1, wherein the second semiconductor device is directly connected to the external terminal and the first semiconductor device via bonding wires.

* * * * *